United States Patent
Shue et al.

(10) Patent No.: US 6,531,389 B1
(45) Date of Patent: Mar. 11, 2003

(54) METHOD FOR FORMING INCOMPLETELY LANDED VIA WITH ATTENUATED CONTACT RESISTANCE

(75) Inventors: Shau-Lin Shue, Hsin-Chu (TW); Mei-Yun Wang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/467,130

(22) Filed: Dec. 20, 1999

(51) Int. Cl.[7] .......................................... H01L 21/4763
(52) U.S. Cl. .................. 438/637; 438/623; 438/621; 438/631; 438/958
(58) Field of Search ................................ 438/623, 624, 438/622, 626, 631, 637, 958

(56) References Cited

U.S. PATENT DOCUMENTS

| | | | |
|---|---|---|---|
| 5,270,267 A | * 12/1993 | Ouellet | 437/231 |
| 5,432,073 A | 7/1995 | Wu et al. | 437/195 |
| 5,506,177 A | 4/1996 | Kishimoto et al. | 437/195 |
| 5,545,289 A | * 8/1996 | Chen et al. | 156/643.1 |
| 5,565,384 A | 10/1996 | Havemann | 437/228 |
| 5,607,773 A | 3/1997 | Ahlburn et al. | 428/427 |
| 5,643,407 A | 7/1997 | Chang | 156/644.1 |
| 5,750,403 A | 5/1998 | Inoue et al. | 438/787 |
| 5,763,010 A | 6/1998 | Guo et al. | 427/376.2 |
| 5,818,111 A | 10/1998 | Jeng et al. | 257/776 |
| 5,866,945 A | * 2/1999 | Chen et al. | 257/750 |
| 5,908,316 A | * 6/1999 | Le et al. | 438/362 |
| 5,958,798 A | * 9/1999 | Shields | 438/710 |
| 5,962,344 A | * 10/1999 | Tu et al. | 438/694 |
| 5,969,425 A | * 10/1999 | Chen et al. | 257/774 |
| 5,985,747 A | * 11/1999 | Taguchi | 438/622 |
| 5,994,240 A | * 11/1999 | Thakur | 438/758 |
| 6,030,891 A | * 2/2000 | Tran et al. | 438/623 |
| 6,060,384 A | * 5/2000 | Chen et al. | 438/623 |
| 6,384,483 B1 | * 5/2002 | Igarashi et al. | 257/759 |

* cited by examiner

*Primary Examiner*—Matthew Smith
*Assistant Examiner*—Renzo N. Rocchegiani
(74) *Attorney, Agent, or Firm*—George O. Saile; Stephen B. Ackerman; Stephen G. Stanton

(57) ABSTRACT

A method for forming a via through a dielectric layer. There is first provided a substrate. There is then formed over the substrate a patterned conductor layer. There is then formed covering the patterned conductor layer a dielectric layer. There is then formed through the dielectric layer a via to access the patterned conductor layer, where the via is incompletely landed upon the patterned conductor layer. There is then purged the via while employing a vacuum purging method to form a purged via. There is then passivated the purged via and passivated the patterned conductor layer exposed within the purged via while employing a plasma passivation method to form a plasma passivated purged via and a plasma passivated patterned conductor layer. Finally, there is then formed into the plasma passivated purged via a conductor stud layer. Incident to employing the purging of the via to form the purged via and the plasma passivating of the purged via to form the plasma passivated purged via, the conductor stud layer when formed into the plasma passivated purged via is formed with attenuated contact resistance with respect to the plasma passivated patterned conductor layer.

47 Claims, 3 Drawing Sheets

METHOD FOR FORMING INCOMPLETELY LANDED VIA WITH ATTENUATED CONTACT RESISTANCE

BACKGROUND OF THE INVENTION

1. Field of the Invention

The present invention relates generally to methods for forming vias through dielectric layers within microelectronic fabrications. More particularly, the present invention relates to methods for forming with attenuated contact resistance incompletely landed vias through dielectric layers to access patterned conductor layers within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and patterned microelectronic conductor layer dimensions have decreased, it has become more common in the art of microelectronic fabrication to form interposed between the patterns of narrow linewidth patterned microelectronic conductor layers within microelectronic fabrications low dielectric constant microelectronic dielectric materials. Within the context of the present invention, narrow linewidth patterned microelectronic conductor layers within microelectronic fabrications are typically characterized by a linewidth of less than about 0.5 microns, more typically of a linewidth of from about 0.1 to about 0.4 microns. Similarly, low dielectric constant microelectronic dielectric materials when employed within microelectronic fabrications formed interposed between the patterns of patterned microelectronic conductor layers within microelectronic fabrications are typically characterized by a dielectric constant of less than about 4.0, more typically of a dielectric constant of from about 1.5 to about 3.8. In comparison, conventional silicon containing dielectric materials, such as but not limited to silicon oxide dielectric materials, silicon nitride dielectric materials and silicon oxynitride dielectric materials, typically have a dielectric constant in a range of from about 4 to about 8 .

Within the context of the present disclosure, low dielectric constant microelectronic dielectric materials may include, but are not limited to: (1) spin-on-glass (SOG) low dielectric constant dielectric materials (such as but not limited to silicate spin-on-glass (SOG) dielectric materials and silsesquioxane spin-on-glass (SOG) dielectric materials (such as but not limited to hydrogen silsesquioxane spin-on-glass (SOG) dielectric materials, carbon bonded hydrocarbon silsesquioxane spin-on-glass (SOG) dielectric materials and carbon bonded fluorocarbon silsesquioxane spin-on-glass (SOG) dielectric materials)); (2) spin-on-polymer (SOP) low dielectric constant dielectric materials (such as but not limited to polyimide spin-on-polymer (SOP) dielectric materials, poly arylene ether spin-on-polymer (SOP) dielectric materials and fluorinated analogs thereof; (3) amorphous carbon dielectric materials (including fluorinated analogs thereof); and (4) fluorinated conventional silicon containing dielectric materials (such as but not limited to fluorosilicate glass (FSG) dielectric materials).

Low dielectric constant dielectric materials are desirable when formed interposed between the patterns of narrow linewidth patterned microelectronic conductor layers within microelectronic fabrications since such low dielectric constant dielectric materials provide microelectronic fabrications with enhanced microelectronic fabrication speed, reduced patterned microelectronic conductor layer parasitic capacitance and reduced patterned microelectronic conductor layer cross-talk.

While microelectronic fabrications having formed therein narrow linewidth patterned microelectronic conductor layers having formed interposed between their patterns low dielectric constant microelectronic dielectric materials are thus desirable within the art of microelectronic fabrication, microelectronic fabrications having formed therein narrow linewidth patterned microelectronic conductor layers having formed interposed between their patterns low dielectric constant microelectronic dielectric materials are nonetheless not formed entirely without problems in the art of microelectronic fabrication.

In particular, it is known in the art of microelectronic fabrication that when forming a conductor stud layer into a via formed through a dielectric layer formed of a low dielectric constant microelectronic dielectric material to access a narrow linewidth patterned microelectronic conductor layer within a microelectronic fabrication there is often experienced contact resistance increases since many low dielectric constant microelectronic dielectric materials readily sorb and desorb moisture and solvents which may contribute to oxidation or corrosion of the conductor stud layer and/or the narrow linewidth patterned microelectronic conductor layer. Similarly, such sorbtion and desorbtion induced contact resistance increases are often exacerbated under circumstances where the via formed through the microelectronic dielectric layer to access the narrow linewidth patterned microelectronic conductor layer is not completely landed, but rather partially offset, from the narrow linewidth patterned microelectronic conductor layer, since under such circumstances there is typically not formed a contiguous and reliable interface between the narrow linewidth patterned microelectronic conductor layer and the conductor stud layer.

It is thus towards the goal of forming within the art of microelectronic fabrication, with attenuated contact resistance, conductor stud layers into vias through dielectric layers to access patterned conductor stud layers within the microelectronic fabrications, where the vias are incompletely landed upon patterned conductor layers within those microelectronic fabrications, that the present invention is directed. More particularly, the present invention is directed towards the foregoing object under circumstances where the dielectric layers are formed of low dielectric constant dielectric materials.

Various methods have been disclosed in the art of microelectronic fabrication for forming microelectronic conductor structures and/or microelectronic dielectric structures with desirable properties within microelectronic fabrications.

For example, Wu et al., in U.S. Pat. No. 5,432,073, discloses a method for forming within a microelectronic fabrication a conductor stud layer into a via formed through a dielectric layer formed at least in part of a spin-on-glass (SOG) dielectric material to access a patterned conductor layer within the microelectronic fabrication, while avoiding a contact resistance increase of the conductor stud layer with respect to the patterned conductor layer. The method realizes the foregoing object by degassing the spin-on-glass (SOG) dielectric material exposed within the via at a temperature of from about 300 to about 500 degrees centigrade prior to forming within the via the conductor stud layer.

In addition, Kishimoto et al., in U.S. Pat. No. 5,506,177, discloses a method for forming within a microelectronic fabrication a spin-on-glass (SOG) sandwich composite planarizing dielectric layer construction with enhanced crack resistance and enhanced moisture resistance, while employing a hydrogen silsesquioxane (HSQ) spin-on-glass (SOG) low dielectric constant dielectric material when forming a spin-on-glass (SOG) planarizing layer within the spin-on-glass (SOG) sandwich composite planarizing dielectric layer construction. The method realizes the foregoing object by employing a two step thermal annealing method for curing and thermal annealing of the spin-on-glass (SOG) planarizing layer, wherein a second thermal annealing step within the two step thermal annealing method reflows a thermally cured hydrogen silsesquioxane spin-on-glass (SOG) dielectric material formed within a first thermal annealing step within the two step thermal annealing method.

Further, Havemann, in U.S. Pat. No. 5,565,384, discloses a method for forming, with enhanced microelectronic fabrication stability, reliability and performance, a via through a dielectric layer to access a patterned conductor layer within a microelectronic fabrication. The method employs a low dielectric constant dielectric material interposed between the patterns of a patterned microelectronic conductor layer within the microelectronic fabrication, where the low dielectric constant dielectric material serves as an etch stop material when forming the via through an upper lying dielectric layer formed thereupon to access the patterned conductor layer within the microelectronic fabrication.

Still further, Ahlburn et al., in U.S. Pat. No. 5,607,773, disclose a method for forming within a microelectronic fabrication a low dielectric constant spin-on-glass (SOG) sandwich composite planarizing dielectric layer construction with avoiding a need for a plasma etchback processing step for etching back a low dielectric constant spin-on-glass (SOG) planarizing layer within the low dielectric constant spin-on-glass (SOG) sandwich composite planarizing dielectric layer construction. The method realizes the foregoing object by employing when forming the low dielectric constant spin-on-glass (SOG) planarizing layer a hydrogen silsesquioxane (HSQ) spin-on-glass (SOG) planarizing dielectric material which is pyrolized to form a low density and low dielectric constant silicon oxide dielectric material for which reactive ion etch (RIE) etchback processing is not needed when forming the low dielectric constant spin-on-glass (SOG) sandwich composite planarizing dielectric layer construction.

Still further, Chang, in U.S. Pat. No. 5,643,407, discloses a method for forming within a microelectronic fabrication a via through a spin-on-glass (SOG) sandwich composite planarizing dielectric layer construction to access a patterned conductor layer formed beneath the spin-on-glass (SOG) sandwich composite planarizing dielectric layer construction, where when a conductor stud layer is formed into the via there is an attenuated contact resistance of the conductor stud layer with respect to the patterned conductor layer. The method realizes the foregoing object by first treating portions of a spin-on-glass (SOG) planarizing dielectric layer exposed within the via with a nitrogen plasma prior to forming within the via the conductor stud layer.

Still further, Inoue et al., in U.S. Pat. No. 5,750,403, discloses a method for forming within a microelectronic fabrication a thermally cured hydrogen silsesquioxane (HSQ) dielectric layer absent thermally induced projections from the thermally cured hydrogen silsesquioxane (HSQ) dielectric layer. The method realizes the foregoing object by first thermally curing a hydrogen silsesquioxane (HSQ) dielectric layer within a nitrogen atmosphere to form a once thermally cured hydrogen silsesquioxane (HSQ) dielectric layer of a pre-ceramic phase, and then after forming a barrier dielectric layer upon the once thermally cured hydrogen silsesquioxane (HSQ) dielectric layer thermally curing again the once thermally cured hydrogen silsesquioxane (HSQ) dielectric layer in a second thermal annealing method to form from the once thermally cured hydrogen silsesquioxane (HSQ) dielectric layer of the pre-ceramic phase a twice thermally cured hydrogen silsesquioxane (HSQ) dielectric layer of the ceramic phase.

Still further, Guo et al., in U.S. Pat. No. 5,763,010 discloses a method for forming within a microelectronic fabrication a halogen doped silicon oxide dielectric layer with enhanced stability of the halogen doped silicon oxide dielectric layer with respect to outgassing of halogen atoms from the halogen doped silicon oxide dielectric layer. The halogen doped silicon oxide dielectric layer realizes the foregoing object by thermally outgassing from the halogen doped silicon oxide dielectric layer mobile halogen atoms at a temperature of from about 300 to about 500 degrees centigrade prior to forming upon the thermally outgassed halogen doped silicon oxide dielectric layer a barrier layer.

Finally, Jeng et al., in U.S. Pat. No. 5,818,111, disclose a method for forming within a microelectronic fabrication a dielectric layer comprising a hydrogen silsesquioxane (HSQ) dielectric material formed with enhanced properties within the microelectronic fabrication. The method employs forming interposed between sub-layers of the hydrogen silsesquioxane (HSQ) dielectric material within the dielectric layer intervening stabilizing sub-layers of a silicon oxide dielectric material.

Desirable in the art of microelectronic fabrication are additional methods and materials for forming within microelectronic fabrications, with attenuated contact resistance, conductor stud layers into vias through dielectric layers to access patterned conductor layers within the microelectronic fabrications, where the vias are incompletely landed upon patterned conductor layers within those microelectronic fabrications. More particularly desirable in the art of microelectronic fabrication are methods and materials directed towards the foregoing object, where the dielectric layers are formed of low dielectric constant dielectric materials.

It is towards the foregoing objects that the present invention is both generally and more specifically directed.

SUMMARY OF THE INVENTION

A first object of the present invention is to provide a method for forming within a microelectronic fabrication a via through a dielectric layer to access a patterned conductor layer formed beneath the dielectric layer, where the via is incompletely landed upon the patterned conductor layer.

A second object of the present invention is to provide a method in accord with the first object of the present invention, where when a conductor stud layer is formed into the via, the conductor stud layer is formed with attenuated contact resistance with respect to the patterned conductor layer.

A third object of the present invention is to provide a method in accord with the first object of the present invention and the second object of the present invention, wherein the dielectric layer is formed of a low dielectric constant dielectric material.

A fourth object of the present invention is to provide a method in accord with the first object of the present invention, the second object of the present invention and the third object of the present invention, which method is readily commercially implemented.

In accord with the objects of the present invention, there is provided by the present invention a method for forming a via through a dielectric layer. To practice the method of the present invention, there is first provided a substrate. There is then formed over the substrate a patterned conductor layer. There is then formed covering the patterned conductor layer a dielectric layer. There is then formed through the dielectric layer a via to access the patterned conductor layer, where the via is incompletely landed upon the patterned conductor layer. There is then purged the via while employing a vacuum purging method to form a purged via. There is then passivated the purged via and passivated the patterned conductor layer while employing a plasma passivation method to form a plasma passivated purged via and a plasma passivated patterned conductor layer. Finally, there is then formed into the plasma passivated purged via a conductor stud layer.

There is provided by the present invention a method for forming within a microelectronic fabrication a via through a dielectric layer to access a patterned conductor layer, where the via is incompletely landed with respect to the patterned conductor layer, and where when a conductor stud layer is formed into the via, the conductor stud layer is formed with attenuated contact resistance. The present invention realizes the foregoing objects by employing after forming a via through a dielectric layer, which via is incompletely landed with respect to a patterned conductor layer formed beneath the dielectric layer within the microelectronic fabrication: (1) a purging of the via to form a purged via, followed by; (2) a passivating of the purged via and the patterned conductor layer to form a plasma passivated purged via and a plasma passivated patterned conductor layer prior to forming into the plasma passivated purged via a conductor stud layer contacting the plasma passivated patterned conductor layer.

While it is not entirely clear within the present invention why a conductor stud layer when formed into a plasma passivated purged via accessing a plasma passivated patterned conductor layer is formed with an attenuated contact resistance with respect to the plasma passivated patterned conductor layer in comparison with an otherwise equivalent conductor stud layer formed into a non-purged via and/or non-plasma passivated via to contact a non-plasma passivated patterned conductor layer, it is nonetheless clear that a conductor stud layer formed into a plasma passivated purged via is formed within the context of the present invention with an attenuated contact resistance with respect to a plasma passivated patterned conductor layer accessed by the plasma passivated purged via.

The method of the present invention is readily commercially implemented. The present invention employs methods and materials which are generally known in the art of microelectronic fabrication. Since it is a process control and materials selection which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

There is provided by the present invention a method for forming within a microelectronic fabrication a via through a dielectric layer to access a patterned conductor layer, where the via is incompletely landed with respect to the patterned conductor layer, and where when a conductor stud layer is formed into the via, the conductor stud layer is formed with attenuated contact resistance. The present invention realizes the foregoing objects by employing after forming a via through a dielectric layer, which via is incompletely landed with respect to a patterned conductor layer formed beneath the dielectric layer within the microelectronic fabrication: (1) a purging of the via to form a purged via, followed by; (2) a passivating of the purged via and the patterned conductor layer to form a plasma passivated purged via and a plasma passivated patterned conductor layer prior to forming into the plasma passivated purged via a conductor stud layer contacting the plasma passivated patterned conductor layer.

While it is not entirely clear within the present invention why a conductor stud layer when formed into a plasma passivated purged via accessing a plasma passivated patterned conductor layer is formed with an attenuated contact resistance with respect to the plasma passivated patterned conductor layer in comparison with an otherwise equivalent conductor stud layer formed into a non-purged via and/or non-plasma passivated via to contact a non-plasma passivated patterned conductor layer, it is nonetheless clear that a conductor stud layer formed into a plasma passivated purged via is formed within the context of the present invention with an attenuated contact resistance with respect to a plasma passivated patterned conductor layer accessed by the plasma passivated purged via.

The present invention may be employed for forming through a dielectric layer formed covering a patterned conductor layer a via incompletely landed with respect to the patterned conductor layer, into which incompletely landed via there may be formed with attenuated contact resistance with respect to the patterned conductor layer a conductor stud layer, within microelectronic fabrications including but not limited to integrated circuit microelectronic fabrications, ceramic substrate microelectronic fabrications, solar cell optoelectronic microelectronic fabrications, sensor image array optoelectronic fabrications and display image array optoelectronic microelectronic fabrications.

Figure 1:
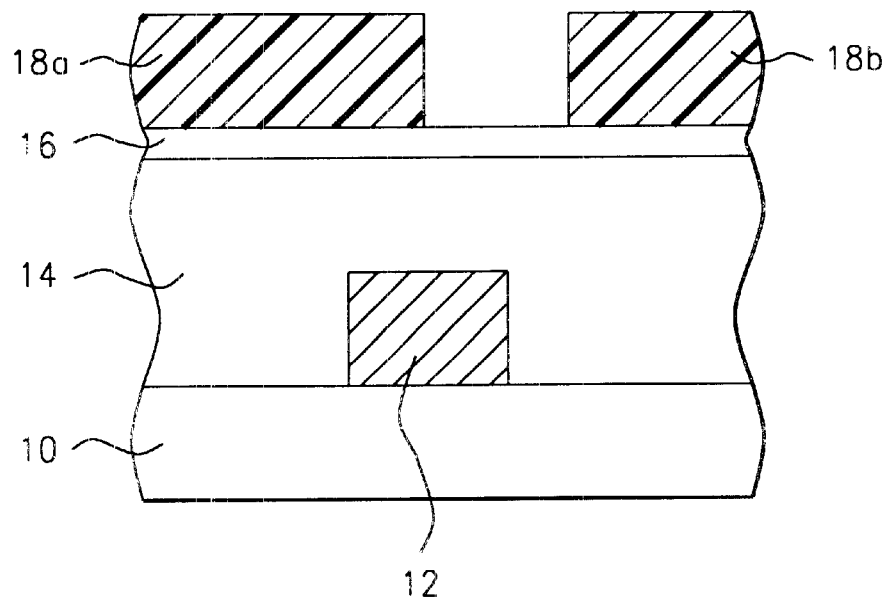
FIG. 1, FIG. 2, FIG. 3, FIG. 4, FIG. 5 and FIG. 6 show a series of schematic cross-sectional diagrams illustrating the results of progressive stages in forming within a microelectronic fabrication a patterned conductor stud layer within a via through a dielectric layer to access a patterned conductor layer within the microelectronic fabrication, in accord with the present invention.

Referring now to FIG. 1 to FIG. 6, there is shown a series of schematic cross-sectional diagrams illustrating the results of progressive stages in forming within a microelectronic fabrication a patterned conductor stud layer within a via through a dielectric layer to access a patterned conductor layer within the microelectronic fabrication, in accord with the present invention. Shown in FIG. 1 is a schematic cross-sectional diagram of the microelectronic fabrication at an early stage in its fabrication in accord with the preferred embodiment of the present invention.

Shown in FIG. 1 is a substrate 10 having formed thereupon a patterned first conductor layer 12, which in turn has formed passivating thereupon a blanket first dielectric layer 14. The blanket first dielectric layer 14 in turn has formed thereupon a blanket second dielectric layer 16. Finally, the blanket second dielectric layer 16 has formed thereupon a pair of patterned photoresist layers 18a and 18b.

Within the preferred embodiment of the present invention with respect to the substrate 10, the substrate 10 may be employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 1, the substrate 10 may comprise the substrate alone as employed within the microelectronic fabrication, or in the alternative, the substrate 10 may comprise the substrate as employed within the microelectronic fabrication, where the substrate has formed thereupon and/or thereover, and thus incorporated therein, any of several additional microelectronic layers as are conventional within the microelectronic fabrication within which is employed the substrate. Similarly with the substrate itself, such additional microelectronic layers may be formed from microelectronic materials selected from the group including but not limited to microelectronic conductor materials, microelectronic semiconductor materials and microelectronic dielectric materials.

Similarly, although also not specifically illustrated within the schematic cross-sectional diagram of FIG. 1, the substrate 10, typically and preferably when the substrate comprises a semiconductor substrate employed within a semiconductor integrated circuit microelectronic fabrication, has formed thereupon and thereover microelectronic devices as are conventional within the microelectronic fabrication within which is employed the substrate 10. Such microelectronic devices may include, but are not limited to resistors, transistors, diodes and capacitors.

Within the preferred embodiment of the present invention with respect to the patterned first conductor layer 12, the patterned first conductor layer 12 may be formed of conductor materials as are conventional in the art of microelectronic fabrication, such conductor materials including but not limited to metal, metal alloy, doped polysilicon and polycide (doped polysilicon/metal silicide stack) conductor materials. More preferably, the patterned first conductor layer 12 is formed of an aluminum, aluminum alloy, copper, copper alloy, doped polysilicon or polycide conductor material. Typically and preferably, the patterned first conductor layer 12 is formed of a bidirectional linewidth of from about 0.1 to about 0.8 microns and a thickness of from about 2000 to about 8000 angstroms.

Within the preferred embodiment of the present invention with respect to the blanket first dielectric layer 14, although the blanket first dielectric layer 14 may be formed from any of several dielectric materials as are conventional in the art of microelectronic fabrication, including but not limited to conventional silicon containing dielectric materials (such as but not limited to silicon oxide dielectric materials, silicon nitride dielectric materials and silicon oxynitride dielectric materials), as well as lower dielectric constant dielectric materials as are less conventional in the art of microelectronic fabrication (such as but not limited to spin-on-glass (SOG) dielectric materials, spin-on-polymer (SOP) dielectric materials, amorphous carbon dielectric materials and materials and fluorinated conventional silicon containing dielectric materials as are described in greater detail within the Description of the Related Art), for the preferred embodiment of the present invention the blanket first dielectric layer 14 is preferably formed of one of the foregoing lower dielectric constant dielectric materials. More preferably, the blanket first dielectric layer 14 is formed of a hydrogen silsesquioxane (HSQ) spin-on-glass (SOG) low dielectric constant dielectric material, available for example and without limitation, from Allied-Signal Corporation. Typically and preferably, such a hydrogen silsesquioxane (HSQ) spin-on-glass (SOG) low dielectric constant dielectric material is spin coated over the substrate 10 and thermally cured at a temperature of from about 250 to about 450 degrees centigrade to form the blanket first dielectric layer 14, when cured, of thickness from about 5000 to about 9000 angstroms.

Similarly, within the preferred embodiment of the present invention with respect the blanket second dielectric layer 16, although the blanket second dielectric layer 16 is generally optional within the present invention and in particular not needed when the blanket first dielectric layer 14 is formed of a conventional silicon containing dielectric material (such as but not limited to a silicon oxide dielectric material, a silicon nitride dielectric material or a silicon oxynitride dielectric material), the blanket second dielectric layer 16 is typically and preferably employed within the present invention, and it is formed of a conventional silicon containing dielectric material (such as but not limited to a silicon oxide dielectric material, a silicon nitride dielectric material or a silicon oxynitride dielectric material), particularly under circumstances where the blanket first dielectric layer 14 is formed of a low dielectric constant dielectric material which is otherwise susceptible to etching within an oxygen containing plasma which is employed at least in part for subsequently stripping from a microelectronic fabrication derived from the microelectronic fabrication whose schematic cross-sectional diagram is illustrated in FIG. 1 the pair of patterned photoresist layers 18a and 18b. Typically and preferably, the blanket second dielectric layer 16 is formed to a thickness of from about 1000 to about 4000 angstroms.

Finally, within the preferred embodiment of the present invention with respect to the pair of patterned photoresist layers 18a and 18b, the pair of patterned photoresist layers 18a and 18b may be formed from any of several photoresist materials as are conventional in the art of microelectronic fabrication, including photoresist materials selected from the general groups of photoresist materials including but not limited to positive photoresist materials and negative photoresist materials.

Figure 2:
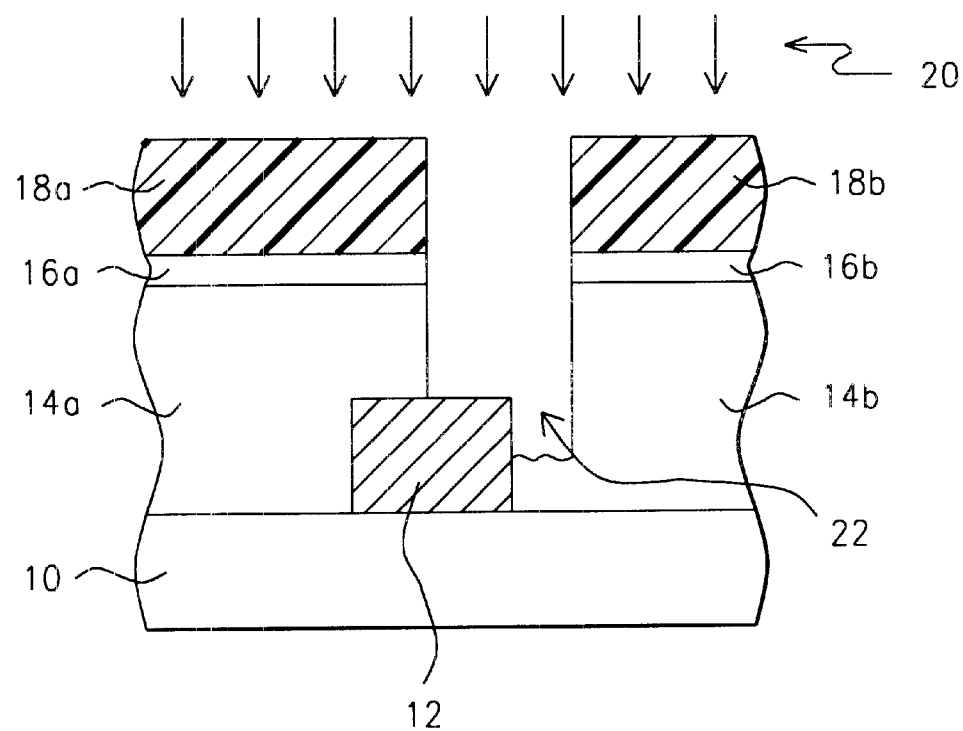

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein there is formed an incompletely landed via 22 through the blanket second dielectric layer 16 and the blanket first dielectric layer 14 to expose a portion of the patterned first conductor layer 12 and thus form a corresponding pair of patterned second dielectric layers 16a and 16b and a corresponding pair of patterned first dielectric layers 14a and 14b, while employing the pair of patterned photoresist layers 18a and 18b as a pair of etch mask layers, the incompletely landed via 22 being formed through use of a plasma etch method employing an etching plasma 20.

Within the preferred embodiment of the present invention, the etching plasma 20 employs an etchant gas composition which is appropriate for the dielectric materials from which are formed the blanket second dielectric layer 16 and the blanket first dielectric layer 14, which within the context of the preferred embodiment of the present invention when the blanket second dielectric layer 16 and the blanket first dielectric layer 14 are formed of the corresponding silicon oxide dielectric material and hydrogen silsesquioxane (HSQ) spin-on-glass (SOG) dielectric material will typically and preferably employ an etchant gas composition which upon plasma activation provides an active fluorine containing etchant species.

Figure 3:
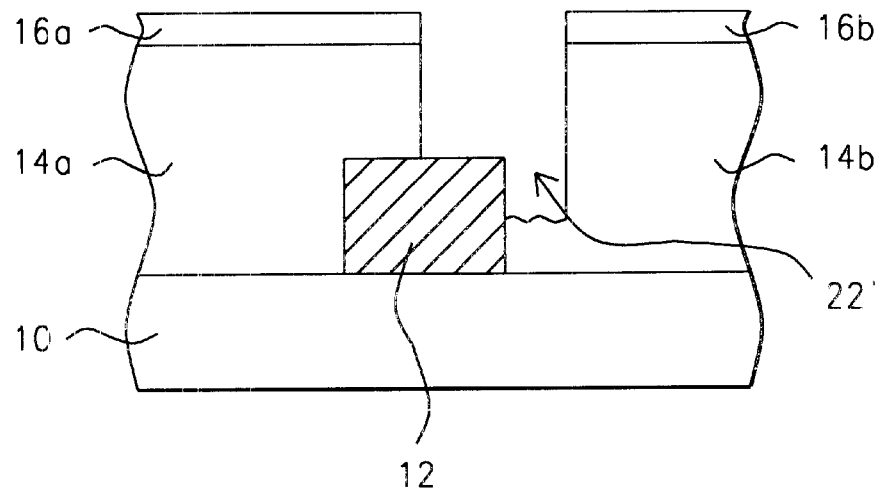

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of a microelectronic fabrication otherwise equivalent to the microelectronic fabrication whose schematic cross-sectional diagram is illustrated in FIG. 2, but wherein, in a first instance, there has been stripped from the pair of patterned second dielectric layers 16a and 16b the pair of patterned photoresist layers 18a and 18b.

Within the preferred embodiment of the present invention, the pair of patterned photoresist layers 18a and 18b may be stripped from the pair of patterned second dielectric layers 16a and 16b to provide in part the microelectronic fabrication whose schematic cross-sectional diagram is illustrated in FIG. 3 from the microelectronic fabrication whose schematic cross-sectional diagram is illustrated in FIG. 2 while employing photoresist stripping methods as are conventional in the art of microelectronic fabrication, such photoresist stripping methods including but not limited to dry oxygen plasma photoresist stripping methods, wet chemical photoresist stripping methods and aggregates of dry oxygen plasma photoresist stripping methods and wet chemical photoresist stripping methods. For the preferred embodiment of the present invention, the pair of patterned photoresist layers 18a and 18b is typically and preferably stripped from the pair of patterned second dielectric layers 16a and 16b to form in part from the microelectronic fabrication whose schematic cross-sectional diagram is illustrated in FIG. 2 the microelectronic fabrication whose schematic cross-sectional diagram is illustrated in FIG. 3 while employing a dry oxygen plasma photoresist stripping method followed by a wet chemical photoresist stripping method employing an hydroxyl amine wet chemical solvent.

There is also shown within the schematic cross-sectional diagram of FIG. 3 a thermal/vacuum purge 24 which is employed to form from the incompletely landed via 22 a purged incompletely landed via 22'.

As discussed below, the term "purge" means flowing a nitrogen ($N_2$) atmosphere/gas or a nitrogen/hydrogen ($N_2/H_2$) atmosphere/gas, among others, to evacuate any other gasses or byproducts. The term "vacuum purging method" is defined in this invention as conducting a purge at a low pressure and at an elevated temperature. "Purging the via" 22 is defined as using a vacuum purging method by flowing an $N_2$ or an $N_2/H_2$ atmosphere/gas into incompletely landed via 22 at a low pressure and an elevated temperature as defined below, such that the via etch gas and etch byproducts are displaced by the selected atmosphere/gas and replaced with the selected atmosphere/gas to yield a purged incompletely landed via 22'.

Within the preferred embodiment of the present invention, the thermal/vacuum purge 24 is typically and preferably undertaken within a atmosphere selected from the group including but not limited to nitrogen atmospheres and nitrogen/hydrogen atmospheres. Typically and preferably, the thermal/vacuum purge 24 is undertaken employing: (1) a reactor chamber pressure cycled from a low pressure of from about 1E-6 to about 1E-3 torr to a high pressure of from about 0.1 to about 10 mtorr; (2) a substrate 10 temperature of from about 150 to about 450 degrees centigrade; (3) a purge time at the lower pressure of from about 5 to about 120 seconds, a purge time at the higher pressure of from about 5 to about 120 seconds; (4) a number of purge cycles of from about 1 to about 6; (5) a nitrogen flow rate of from about 100 to about 600 standard cubic centimeters per minute (sccm); and (6) a hydrogen flow rate (if present) of from about 100 to about 600 standard cubic centimeters per minute (sccm).

While not wishing to be bound to any particular theory of operation of the present invention, it is believed that the thermal/vacuum purge 24 provides for degassing of sorbable and desorbable materials from within the incompletely landed via 22 when forming therefrom the purged incompletely landed via 22'.

Figure 4:
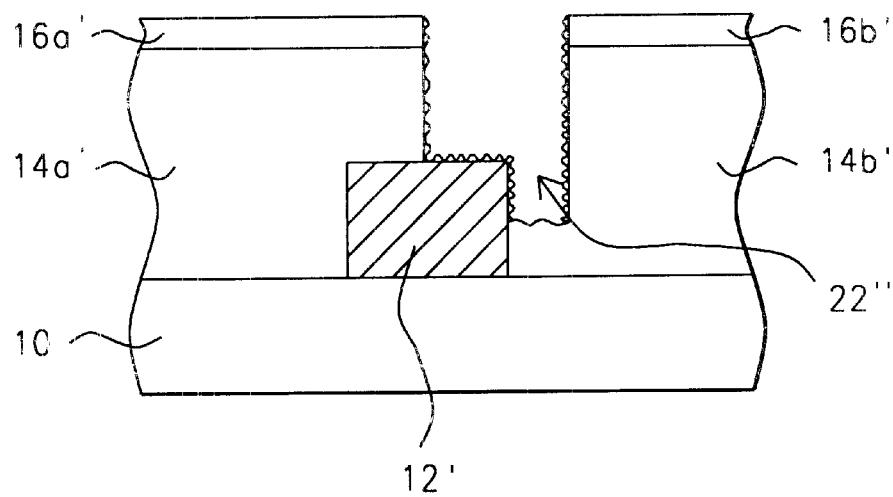

Referring now to FIG. 4, there is shown a schematic cross-sectional diagram illustrating the results of further processing of the microelectronic fabrication whose schematic cross-sectional diagram is illustrated in FIG. 3.

Shown in FIG. 4 is a schematic cross-sectional diagram of a microelectronic fabrication otherwise equivalent to the microelectronic fabrication whose schematic cross-sectional diagram is illustrated in FIG. 3, but wherein the microelectronic fabrication has been treated with a passivating plasma 26 to: (1) form from the pair of patterned second dielectric layers 16a and 16b and the pair of patterned first dielectric layers 14a and 14b a corresponding pair of plasma passivated patterned second dielectric layers 16a' and 16b' and a corresponding pair of plasma passivated patterned first dielectric layers 14a' and 14b'; and (2) form from the patterned first conductor layer 12 a plasma passivated patterned first conductor layer 12', thus also forming from the purged incompletely landed via 22' a plasma passivated purged incompletely landed via 22".

Within the preferred embodiment of the present invention, the passivating plasma 26 preferably employs a passivating plasma gas composition selected from the group including but not limited to a nitrogen passivating plasma gas composition and a nitrogen and hydrogen passivating plasma gas composition.

Typically and preferably, when passivating the purged incompletely landed via 22' to form the plasma passivated purged incompletely landed via 22" when formed upon an eight inch diameter substrate 10, the passivating plasma 26 also employs: (1) a reactor chamber pressure of from about 0.1 to about 10 mtorr; (2) a source radio frequency of from about 150 to about 800 watts at a source radio frequency of 13.56 MHZ; (3) a substrate 10 temperature of from about 150 to about 450 degrees centigrade; (4) a nitrogen flow rate of from about 100 to about 600 standard cubic centimeters per minute (sccm); (5) a hydrogen flow rate of from about 100 to about 600 standard cubic centimeters per minute (sccm); and (6) an exposure time of at least several seconds.

Although not specifically illustrated within the schematic cross-sectional diagrams of FIG. 3 and FIG. 4, within the preferred embodiment of the present invention, the thermal/vacuum purge method which employs the thermal/vacuum purge 24 as illustrated within the schematic cross-sectional diagram of FIG. 3, and the plasma passivation method which employs the passivating plasma 26 as illustrated within the schematic cross-sectional diagram of FIG. 4 are typically and preferably, although not exclusively, undertaken in-situ within a single reactor chamber or within adjoining reactor chambers within a multi-chamber "cluster" reactor tool, without exposure to ambient environment.

While not wishing to be bound to any particular theory of operation of the present invention, it is believed that the passivating plasma 26 passivates all surfaces of the plasma passivated purged incompletely landed via 22", including crevices within unlanded portions of the plasma passivated purged incompletely landed via 22" and sidewall surfaces of the plasma passivated patterned first conductor layer 12', thus providing for uniform surfaces for contact with a subsequently formed barrier layer and conductor stud layer within the plasma passivated purged incompletely landed via 22".

Figure 5:
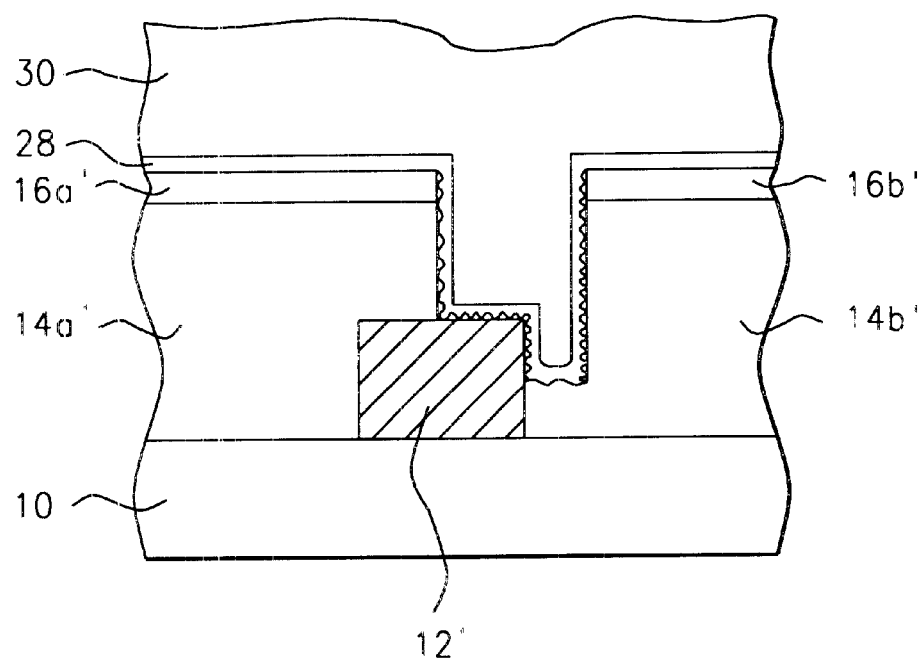

Referring now to FIG. 5, there is shown a schematic cross-sectional diagram illustrating the results of further processing of the microelectronic fabrication whose schematic cross-sectional diagram is illustrated in FIG. 4.

Shown in FIG. 5 is a microelectronic fabrication otherwise equivalent to the microelectronic fabrication whose schematic cross-sectional diagram is illustrated in FIG. 4, but wherein: (1) there is formed conformally into the plasma passivated purged incompletely landed via 22" a blanket barrier layer 28 which does not completely fill the plasma passivated purged incompletely landed via 22"; and (2) there is formed upon the blanket barrier layer 28 a blanket second conductor layer 30 which does completely fill the plasma passivated purged incompletely landed via 22".

Within the preferred embodiment of the present invention with respect to the blanket barrier layer 28, the blanket barrier layer 28 may be formed of barrier materials as are conventional in the art of microelectronic fabrication, including but not limited to titanium, titanium nitride, tungsten, tungsten nitride, tantalum and tantalum nitride barrier materials. Typically and preferably the blanket barrier layer 28 is formed of a titanium nitride barrier material formed to a thickness of from about 30 to about 400 angstroms.

Similarly, within the preferred embodiment of the present invention with respect to the blanket second conductor layer 30, the blanket second conductor layer 30 may similarly be formed of conductor materials as are conventional in the art of microelectronic fabrication, including but not limited to aluminum, aluminum alloy, copper, copper alloy, tungsten and tungsten alloy conductor materials. Typically and preferably, the blanket second conductor layer 30 is formed of a tungsten conductor material, formed upon the blanket barrier layer 28 to a thickness of from about 3000 to about 4000 angstroms.

Figure 6:
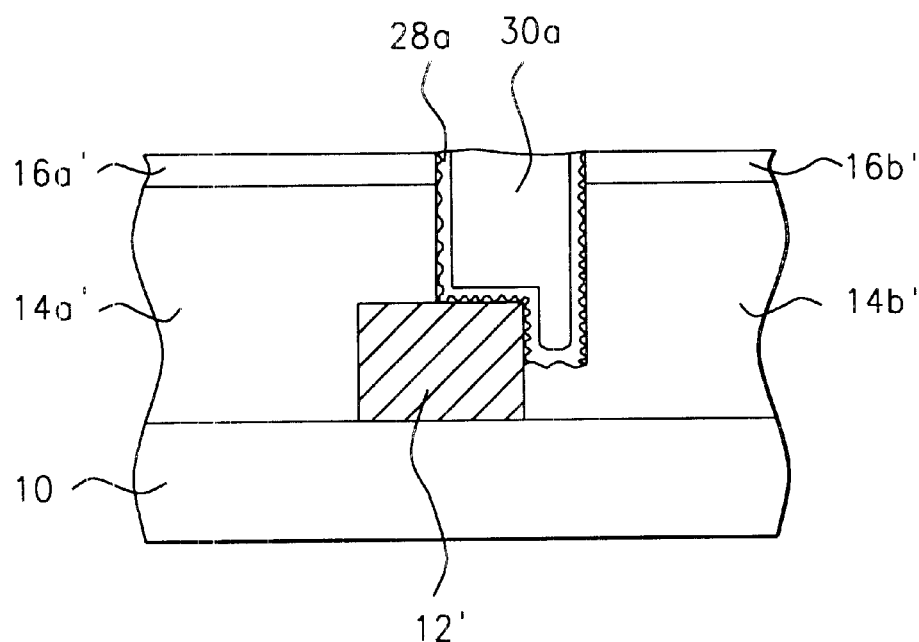

Referring now to FIG. 6, there is shown a schematic cross-sectional diagram illustrating the results of further processing of the microelectronic fabrication whose schematic cross-sectional diagram is illustrated in FIG. 5.

Shown in FIG. 6 is a schematic cross-sectional diagram of a microelectronic fabrication otherwise equivalent to the microelectronic fabrication whose schematic cross-sectional diagram is illustrated in FIG. 5, but wherein the blanket second conductor layer 30 and the blanket barrier layer 28 have been planarized to form a corresponding patterned conductor stud layer 30a formed upon a patterned barrier layer 28a in turn formed into the plasma passivated purged incompletely landed via 22". Within the preferred embodiment of the present invention, the patterned conductor stud layer 30a and the patterned barrier layer 28a are typically and preferably formed from the corresponding blanket second conductor layer 30 and blanket barrier layer 28 while employing chemical mechanical polish (CMP) planarizing methods as are conventional in the art of microelectronic fabrication.

Upon forming the microelectronic fabrication whose schematic cross-sectional diagram is illustrated in FIG. 6, there is formed a microelectronic fabrication wherein the patterned conductor stud layer 30a has an attenuated contact resistance with respect to the plasma passivated patterned first conductor layer 12'. The attenuated contact resistance of the patterned conductor stud layer 30a with respect to the plasma passivated patterned first conductor layer 12' is effected by sequentially: (1) purging the incompletely landed via 22 as illustrated within the schematic cross-sectional diagram of FIG. 2 to form the purged incompletely landed via 22' as illustrated within the schematic cross-sectional diagram of FIG. 3; and (2) subsequently plasma passivating the purged incompletely landed via 22' and patterned first conductor layer 12 as illustrated within the schematic cross-sectional diagram of FIG. 3 to form the plasma passivated purged incompletely landed via 22" and plasma passivated patterned first conductor layer 12' as illustrated within the schematic cross-sectional diagram of FIG. 4, prior to forming within the plasma passivated purged incompletely landed via 22" the patterned conductor stud layer 30a.

EXAMPLES

There was obtained a series of four semiconductor substrates and formed over each semiconductor substrates within the series of four semiconductor substrates was a silicon oxide dielectric layer formed to a thickness of about 7000 angstroms while employing a plasma enhanced chemical vapor deposition (PECVD) method. Formed upon each of the silicon oxide dielectric layers was a series of patterned first conductor layers.

Formed covering the series of patterned first conductor layers and portions of the silicon oxide dielectric layers exposed adjoining the series of patterned first conductor layers over each of the semiconductor substrates was a series of blanket first dielectric layers formed of a hydrogen silsesquioxane (HSQ) spin-on-glass (SOG) dielectric material formed to a thickness of about 5000 angstroms and thermally cured within a nitrogen atmosphere at a temperature of about 400 degrees centigrade for a time period of about 50 minutes to provide the layers of thermally cured hydrogen silsesquioxane (HSQ) dielectric material.

Similarly, there was formed upon each of the blanket first dielectric layers a blanket second dielectric layer formed of silicon oxide dielectric material formed employing a plasma enhanced chemical vapor deposition (PECVD) method. Each of the blanket second dielectric layers was formed to a thickness of about 2000 angstroms.

Each of the blanket second dielectric layers and the blanket first dielectric layers upon each of the four semiconductor substrates was then etched to form a corresponding series of patterned second dielectric layers and patterned first dielectric layers having formed therethrough a series of unlanded vias which accessed the series of patterned conductor layers.

One of the semiconductor substrates received no additional treatment.

A second of the semiconductor substrates received a thermal/vacuum purge treatment in accord with the preferred embodiment of the present invention. The thermal/vacuum purge treatment employed: (1) a lower reactor chamber pressure of about 1E-5 torr and an upper reactor chamber pressure of about 0.2 mtorr; (2) a semiconductor substrate temperature of about 400 degrees centigrade; (3) a lower reactor chamber pressure purge time of about 10 seconds, an upper reactor chamber pressure purge time of about 20 seconds; (4) a nitrogen flow rate of about 300 standard cubic centimeters per minute (sccm); and (5) a simultaneous hydrogen flow rate of about 300 standard cubic centimeters per minute (sccm), for a total of 4 purge cycles.

A third of the semiconductor substrates received a plasma passivation treatment in accord with the present invention. The plasma passivation treatment employed a nitrogen and hydrogen plasma gas composition. The plasma passivation treatment also employed: (1) a reactor chamber pressure of about 0.1 mtorr; (2) a source radio frequency power of about 700 watts at a source radio frequency of 13.56. MHZ; (3) a semiconductor substrate temperature of about 400 degrees centigrade; (4) a nitrogen flow rate of about 300 standard cubic centimeters per minute (sccm); and (5) a hydrogen flow rate of about 300 standard cubic centimeters per minute (sccm), for a plasma passivation time period of about 40 seconds.

A fourth of the four semiconductor substrates received: (1) the thermal/vacuum purge treatment as provided to the second of the four semiconductor substrates, followed in-situ within the same reactor chamber by; (2) the plasma passivation treatment as provided to the third of the four semiconductor substrates.

There was then formed over each of the semiconductor substrates: (1) a blanket titanium nitride barrier layer of thickness about 200 angstroms which did not completely fill each of the incompletely landed vias, where each of the blanket titanium nitride barrier layers in turn had formed thereupon a blanket second conductor layer formed of tungsten formed to a thickness about 3000 angstroms which did completely fill each of the incompletely landed vias. The series of the blanket barrier layers and the blanket second conductor layers were then chemical mechanical polish (CMP) planarized to form a series of patterned conductor stud layers formed of tungsten formed upon a series of patterned barrier layers formed contacting each of the exposed portions of the patterned first conductor layers within either: (1) the incompletely landed vias formed over the first semiconductor substrate; (2) the purged incompletely landed vias formed over the second semiconductor substrate; (3) the plasma passivated incompletely landed vias formed over the third semiconductor substrate; or (4) the plasma passivated purged incompletely landed vias formed over the fourth semiconductor substrate.

There was then measured while employing via chain resistance measurements as are otherwise conventional in the art of microelectronic fabrication, via chain resistances for the patterned conductor stud layers with respect to the patterned first conductor layers for each of a series of four via chains formed upon the four semiconductor substrates while employing the series of patterned first conductor layers, the patterned barrier layers and the patterned conductor stud layers. The measured results for the via chain resistances are reported in Table I.

TABLE I

| Via Post Etch Processing | Via Chain Resistance |
|---|---|
| None | 7.8 +/− 0.6 ohms |
| Purge Only | 6.7 +/− 0.5 |
| Plasma Only | 6.4 +/− 0.4 |
| Purge and Plasma | 6.3 +/− 0.4 |

As is seen from review of the data within Table I, there is observed a significant reduction of via chain resistance for a chain of vias formed employing either a thermal/vacuum purge or a plasma passivation in accord with the preferred embodiment of the present invention. Similarly, when employing sequentially a thermal/vacuum purge followed by a plasma passivation in accord with the preferred embodiment of the present invention there is provided an optimally attenuated contact resistance of a via chain comprised of multiple conductor stud layers with respect to multiple patterned first conductor layers in accord with the present invention.

As is understood by a person skilled in the art, the preferred embodiment and examples of the present invention are illustrative of the present invention rather than limiting of the present invention. Revisions and modifications may be made to methods, materials, structures and dimensions through which is provided the preferred embodiment and examples of the present invention while still providing embodiments and examples in accord with the present invention as defined within the appended claims.

What is claimed is:

1. A method for forming a via through a dielectric layer comprising:
   providing a semiconductor substrate;
   forming over the semiconductor substrate a patterned conductor layer;
   forming covering the patterned conductor layer a dielectric layer;
   forming through the dielectric layer a via to access the patterned conductor layer;
   purging the via to degas the dielectric layer while employing a vacuum purging method to form a purged via;
   passivating the purged via and passivating the patterned conductor layer exposed within the purged via while employing a plasma passivation method to form a plasma passivated purged via and a plasma passivated patterned conductor layer; and
   forming into the plasma passivated purged via a conductor stud layer.

2. The method of claim 1 wherein by purging the via to form the purged via and passivating the purged via to form the plasma passivated purged via the conductor stud layer is formed within the plasma passivated purged via with an attenuated contact resistance with respect to the plasma passivated patterned conductor layer.

3. The method of claim 1 wherein the patterned conductor layer is formed from a conductor material selected from the group consisting of aluminum, aluminum alloy, copper, copper alloy, doped polysilicon and polycide conductor materials.

4. The method of claim 1 wherein the dielectric layer is formed of a low dielectric constant dielectric material selected from the group consisting of spin-on-glass (SOG) dielectric materials, spin-on-polymer (SOP) dielectric materials, amorphous carbon dielectric materials and fluorinated silicon containing dielectric materials.

5. The method of claim 1 wherein the dielectric layer is formed of a hydrogen silsesquioxane (HSQ) spin-on-glass (SOG) dielectric material.

6. The method of claim 1 wherein the vacuum purging method is a multiple cycle thermal vacuum purging method employing a purge gas selected from the group consisting of nitrogen purge gases and nitrogen and hydrogen purge gases.

7. The method of claim 1 wherein the plasma passivation method employs a passivation gas selected from the group consisting of nitrogen passivation gases and nitrogen and hydrogen passivation gases.

8. The method of claim 1 wherein the vacuum purging method and the plasma passivation method are undertaken sequentially in-situ.

9. The method of claim 1, wherein said via purging step is conducted:
within a reactor chamber pressure cycled from about 1E-6 to 1E-3 torr for from about 5 to 120 seconds;
at a substrate temperature from about 150 to 450° C.; and
for from about 1 to 6 purge cycles each having a nitrogen flow rate from about 100 to 600 sccm.

10. The method of claim 1, wherein said via purging step is conducted:
within a reactor chamber pressure cycled from about 1E-6 to 1E-3 torr for from about 5 to 120 seconds;
at a substrate temperature from about 150 to 450° C.; and
for from about 1 to 6 purge cycles each having a nitrogen gas flow rate from about 100 to 600 sccm and a hydrogen gas flow rate from about 100 to 600 sccm.

11. The method of claim 1, wherein said plasma passivation method employs:
a reactor chamber pressure of from about 0.1 to 10 mTorr;
a source radio frequency of from about 150 to 800 watts at a source frequency of about 13.56 MHz;
a substrate temperature of from about 150 to 450° C.;
a nitrogen gas flow rate from about 100 to 600 sccm;
a hydrogen gas flow rate from about 100 to 600 sccm; and
an exposure time of at least several seconds.

12. The method of claim 1, wherein:
forming the via forms sorbable and desorbable materials; and
the via purging step to degas the dielectric layer degasses the sorbable and desorbable materials.

13. The method of claim 1, wherein:
the dielectric layer is formed of a hydrogen silsesquioxane (HSQ) spin-on-glass (SOG) dielectric material;
forming the via forms sorbable and desorbable materials; and
the via purging step to degas the hydrogen silsesquioxane (HSQ) spin-on-glass (SOG) dielectric material dielectric layer degasses the sorbable and desorbable materials.

14. The method of claim 1, wherein where the via is incompletely landed upon the patterned conductor layer.

15. A method for forming a via through a dielectric layer comprising:
providing a substrate;
forming over the substrate a patterned conductor layer;
forming covering the patterned conductor layer a dielectric layer;
forming through the dielectric layer a via to access the patterned conductor layer;
purging the via to degas the dielectric layer while employing a vacuum purging method to form a purged via;
passivating the purged via and passivating the patterned conductor layer exposed within the purged via while employing a plasma passivation method to form a plasma passivated purged via and a plasma passivated patterned conductor layer; said plasma passivation method employing:
a reactor chamber pressure of from about 0.1 to 10 mTorr;
a source radio frequency of from about 150 to 800 watts at a source frequency of about 13.56 MHz;
a substrate temperature of from about 150 to 450° C.;
a nitrogen gas flow rate from about 100 to 600 sccm;
a hydrogen gas flow rate from about 100 to 600 sccm; and
an exposure time of at least several seconds; and
forming into the plasma passivated purged via a conductor stud layer.

16. The method of claim 15, wherein said via purging step is conducted:
within a reactor chamber pressure cycled from about 1E-6 to 1E-3 torr for from about 5 to 120 seconds;
at a substrate temperature from about 150 to 450° C.; and
for from about 1 to 6 purge cycles each having a nitrogen flow rate from about 100 to 600 sccm.

17. The method of claim 15, wherein said via purging step is conducted:
within a reactor chamber pressure cycled from about 1E-6 to 1E-3 torr for from about 5 to 120 seconds;
at a substrate temperature from about 150 to 450° C.; and
for from about 1 to 6 purge cycles each having a nitrogen gas flow rate from about 100 to 600 sccm and a hydrogen gas flow rate from about 100 to 600 sccm.

18. The method of claim 15, wherein by purging the via to form the purged via and passivating the purged via to form the plasma passivated purged via the conductor stud layer is formed within the plasma passivated purged via with an attenuated contact resistance with respect to the plasma passivated patterned conductor layer.

19. The method of claim 15, wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

20. The method of claim 15, wherein the patterned conductor layer is formed from a conductor material selected from the group consisting of aluminum, aluminum alloy, copper, copper alloy, doped polysilicon and polycide conductor materials.

21. The method of claim 15, wherein the dielectric layer is formed from a low dielectric constant dielectric material.

22. The method of claim 15, wherein the vacuum purging method is a multiple cycle thermal vacuum purging method employing a purge gas selected from the group consisting of nitrogen purge gases and nitrogen and hydrogen purge gases.

23. The method of claim 15, wherein the plasma passivation method employs a passivation gas selected from the group consisting of nitrogen passivation gases and nitrogen and hydrogen passivation gases.

24. The method of claim 15, wherein the vacuum purging method and the plasma passivation method are undertaken sequentially in-situ.

25. The method of claim 15, wherein:
forming the via forms sorbable and desorbable materials; and
the via purging step to degas the dielectric layer degasses the sorbable and desorbable materials.

26. The method of claim 15, wherein:
the dielectric layer is formed of a hydrogen silsesquioxane (HSQ) spin-on-glass (SOG) dielectric material;
forming the via forms sorbable and desorbable materials; and
the via purging step to degas the hydrogen silsesquioxane (HSQ) spin-on-glass (SOG) dielectric material dielectric layer degasses the sorbable and desorbable materials.

27. The method of claim 15, wherein where the via is incompletely landed upon the patterned conductor layer.

28. A method for forming a via through a dielectric layer comprising:
providing a substrate;
forming over the substrate a patterned conductor layer;
forming covering the patterned conductor layer a dielectric layer;
forming through the dielectric layer a via to access the patterned conductor layer;
purging the via to degas the dielectric layer while employing a vacuum purging method to form a purged via; said via purging step employing:
a reactor chamber pressure cycled from about 1E-6 to 1E-3 torr for from about 5 to 120 seconds;
a substrate temperature from about 150 to 450° C.; and
from about 1 to 6 purge cycles each having a gas flow rate selected from the group comprising: a nitrogen flow rate from about 100 to 600 sccm; and a nitrogen gas and a hydrogen gas each having a flow rate of from about 100 to 600 sccm;
passivating the purged via and passivating the patterned conductor layer exposed within the purged via while employing a plasma passivation method to form a plasma passivated purged via and a plasma passivated patterned conductor layer; said plasma passivation method employing:
a reactor chamber pressure of from about 0.1 to 10 mTorr;
a source radio frequency of from about 150 to 800 watts at a source frequency of about 13.56 MHz;
a substrate temperature of from about 150 to 450° C.;
a nitrogen gas flow rate from about 100 to 600 sccm;
a hydrogen gas flow rate from about 100 to 600 sccm; and
an exposure time of at least several seconds; and
forming into the plasma passivated purged via a conductor stud layer.

29. The method of claim 28, wherein by purging the via to form the purged via and passivating the purged via to form the plasma passivated purged via the conductor stud layer is formed within the plasma passivated purged via with an attenuated contact resistance with respect to the plasma passivated patterned conductor layer.

30. The method of claim 28, wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

31. The method of claim 28, wherein the patterned conductor layer is formed from a conductor material selected from the group consisting of aluminum, aluminum alloy, copper, copper alloy, doped polysilicon and polycide conductor materials.

32. The method of claim 28, wherein the dielectric layer is formed from a low dielectric constant dielectric material.

33. The method of claim 28, wherein the vacuum purging method is a multiple cycle thermal vacuum purging method employing a purge gas selected from the group consisting of nitrogen purge gases and nitrogen and hydrogen purge gases.

34. The method of claim 28, wherein the plasma passivation method employs a passivation gas selected from the group consisting of nitrogen passivation gases and nitrogen and hydrogen passivation gases.

35. The method of claim 28, wherein the vacuum purging method and the plasma passivation method are undertaken sequentially in-situ.

36. The method of claim 28, wherein:
forming the via forms sorbable and desorbable materials; and
the via purging step to degas the dielectric layer degasses the sorbable and desorbable materials.

37. The method of claim 36, wherein the vacuum purging method and the plasma passivation method are undertaken sequentially in-situ.

38. The method of claim 36, wherein where the via is incompletely landed upon the patterned conductor layer.

39. The method of claim 28, wherein:
the dielectric layer is formed of a hydrogen silsesquioxane (HSQ) spin-on-glass (SOC) dielectric material;
forming the via forms sorbable and desorbable materials; and
the via purging step to degas the hydrogen silsesquioxane (HSQ) spin-on-glass (SOG) dielectric material dielectric layer degasses the sorbable and desorbable materials.

40. The method of claim 28, wherein where the via is incompletely landed upon the patterned conductor layer.

41. A method for forming a via through a dielectric layer comprising:
providing a semiconductor substrate;
forming over the semiconductor substrate a patterned conductor layer;
forming covering the patterned conductor layer a dielectric layer;
forming through the dielectric layer a via to access the patterned conductor layer;
wherein forming via forms sorbable and desorbable materials;
purging the via to degas the dielectric layer while employing a vacuum purging method to form a purged via; the via purging step to degas the dielectric layer degasses the sorbable and desorbable materials;
passivating the purged via and passivating the patterned conductor layer exposed within the purged via while employing a plasma passivation method to form a plasma passivated purged via and a plasma passivated patterned conductor layer; and
forming into the plasma passivated purged via a conductor stud layer.

42. The method of claim 41, wherein by purging the via to form the purged via and passivating the purged via to form the plasma passivated purged via the conductor stud layer is formed within the plasma passivated purged via with an attenuated contact resistance with respect to the plasma passivated patterned conductor layer.

43. The method of claim 41, wherein the patterned conductor layer is formed from a conductor material selected from the group consisting of aluminum, aluminum alloy, copper, copper alloy, doped polysilicon and polycide conductor materials.

44. The method of claim 41, wherein the dielectric layer is formed from a low dielectric constant dielectric material selected from the group consisting of spin-on-glass (SOG) dielectric materials, spin-on-polymer (SOP) dielectric materials, amorphous carbon dielectric materials and fluorinated silicon containing dielectric materials.

45. The method of claim 41, wherein the dielectric layer is formed of a hydrogen silsesquioxane (HSQ) spin-on-glass (SOG) dielectric material.

46. The method of claim 41, wherein the vacuum purging method is a multiple cycle thermal vacuum purging method employing a purge gas selected from the group consisting of nitrogen purge gases and nitrogen and hydrogen purge gases.

47. The method of claim 41, wherein the plasma passivation method employs a passivation gas selected from the group consisting of nitrogen passivation gases and nitrogen and hydrogen passivation gases.

* * * * *